US007809542B2

(12) United States Patent
Bazinet et al.

(10) Patent No.: US 7,809,542 B2
(45) Date of Patent: Oct. 5, 2010

(54) SYSTEM AND METHOD FOR GLITCH ANALYSIS IN CIRCUITS

(75) Inventors: Ryan Bazinet, Walden, NY (US); James Scott Neely, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 606 days.

(21) Appl. No.: 11/745,085

(22) Filed: May 7, 2007

(65) Prior Publication Data

US 2008/0281574 A1 Nov. 13, 2008

(51) Int. Cl.
*G06F 17/50* (2006.01)

(52) U.S. Cl. .................. 703/14; 703/17; 716/2
(58) Field of Classification Search .......... 703/2, 703/14, 17; 716/2; 326/41; 327/156
See application file for complete search history.

(56) References Cited

U.S. PATENT DOCUMENTS

| | | | |
|---|---|---|---|
| 5,835,380 A | | 11/1998 | Roethig |
| 5,838,947 A * | | 11/1998 | Sarin .................. 703/14 |
| 6,212,665 B1 | | 4/2001 | Zarkesh et al. |
| 6,523,154 B2 | | 2/2003 | Cohn et al. |
| 6,631,502 B2 | | 10/2003 | Buffet et al. |
| 6,832,361 B2 | | 12/2004 | Cohn et al. |
| 6,868,374 B1 | | 3/2005 | Ditlow et al. |
| 6,944,552 B2 | | 9/2005 | Francom et al. |
| 6,950,998 B1 | | 9/2005 | Tuan |
| 6,963,204 B2 | | 11/2005 | Deutsch et al. |
| 7,039,536 B2 | | 5/2006 | Nagata et al. |
| 7,076,405 B1 * | | 7/2006 | Uchino ................ 703/2 |
| 7,365,580 B2 * | | 4/2008 | Martin et al. .......... 327/156 |
| 2003/0088395 A1 | | 5/2003 | Frech et al. |
| 2005/0204316 A1 * | | 9/2005 | Nebel et al. .......... 716/2 |
| 2006/0036980 A1 | | 2/2006 | Kobayashi |
| 2006/0123366 A1 | | 6/2006 | Ogawa |
| 2007/0164785 A1 * | | 7/2007 | He ................... 326/41 |

* cited by examiner

*Primary Examiner*—Thai Phan
(74) *Attorney, Agent, or Firm*—Tutunjian & Bitetto, P.C.; Brian P. Verminski, Esq (57) ABSTRACT

A system and method for analyzing power glitch in circuits includes simulating a circuit to provide waveform responses at positions of interest in the circuit. Each waveform response is processed to determine glitch power by comparing optimal energy to actual energy for the waveform. The circuit is adjusted to reduce loss due to the glitch power.

20 Claims, 8 Drawing Sheets

SYSTEM AND METHOD FOR GLITCH ANALYSIS IN CIRCUITS

BACKGROUND

1. Technical Field

The present invention relates to circuit design and analysis and more particularly to a system, tool and method for performing glitch analysis on circuit designs to provide information on power conservation.

2. Description of the Related Art

Glitch power analysis is the analysis of circuit simulation waveforms to determine the amount of power wasted due to excess switching. During a single clock cycle, a capacitor may be charged and discharged multiple times before settling on a final state that may be read on an output pin at the end of the cycle. This charging and discharging can use a lot of power and depending on the severity of the case, can contribute a substantial portion of the total power used. With power constraints being a consistent concern for designers, any tools for identifying areas that can be improved are always a useful resource.

SUMMARY

A system and method for analyzing power glitch in circuits include simulating a circuit to provide waveform responses at positions of interest in the circuit. Each waveform response is processed to determine glitch power by comparing optimal energy to actual energy for the waveform. The circuit is adjusted to reduce loss due to the glitch power.

A system for analyzing power glitch includes a simulator configured to simulate a circuit to provide waveform responses at positions of interest in the circuit. An analysis tool is configured to analyze each waveform response to determine glitch power for the waveform response by comparing optimal energy to actual energy for the waveform. A circuit adjustment module is configured to modify the circuit to reduce loss due to the glitch power.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with present embodiments, glitch power analysis tools are provided. Glitch power analysis includes circuit simulation where waveforms are employed to determine an amount of power wasted due to excess switching or other circuit effects or actions. For example, during a single clock cycle, a capacitor may be charged and discharged multiple times before settling on a final state that is read on an output pin at the end of the cycle. This charging and discharging can use a lot of power and depending on the severity of the case, can contribute a substantial portion of the total power used.

Since a method for identifying glitch power preferably employs voltage waveforms, a simulator is used to generate the waveform data as well as capacitance data for each net in the circuit. A net list describes the list of devices in the circuit being tested where a device can be any basic electronic structure such as a capacitor, resistor, inductor, diode, wire, switch, connector, etc.

The tools provided in accordance with the present principles benefit the overall circuit design process by helping to identify areas that may be wasting power. Since conserving power is an increasing problem in high speed or complex circuits, any tools for identifying areas where power is being lost can help reduce overall power. For example, in a large circuit such as a processor, macros may be replicated multiple times on the chip. If one of those particular macros can be shown to be wasting power, then the overall wasted power for that macro is multiplied by the number of times it is used. Once glitch power is identified, it can be remedied by, e.g., adjusting wire lengths to accommodate for input skew, finding a statistical average of input skew to find the timing needed for minimum glitch power, latching all of the input data, redesigning a macro or component, or any other number of solutions or actions. In a simple test of a 24-bit adder, for example, varying the timing on the input pins resulted in up to 36% of the total power being attributed to glitch power. The tools in accordance with the present embodiments may be used, among other things, to calculate clock power at macro and node levels, and to output a switching factor for each clock cycle and node in a simulation to reduce or eliminate glitch power in a design.

Embodiments of the present invention can take the form of an entirely hardware embodiment, an entirely software embodiment or an embodiment including both hardware and software elements. In a preferred embodiment, the present invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 1:
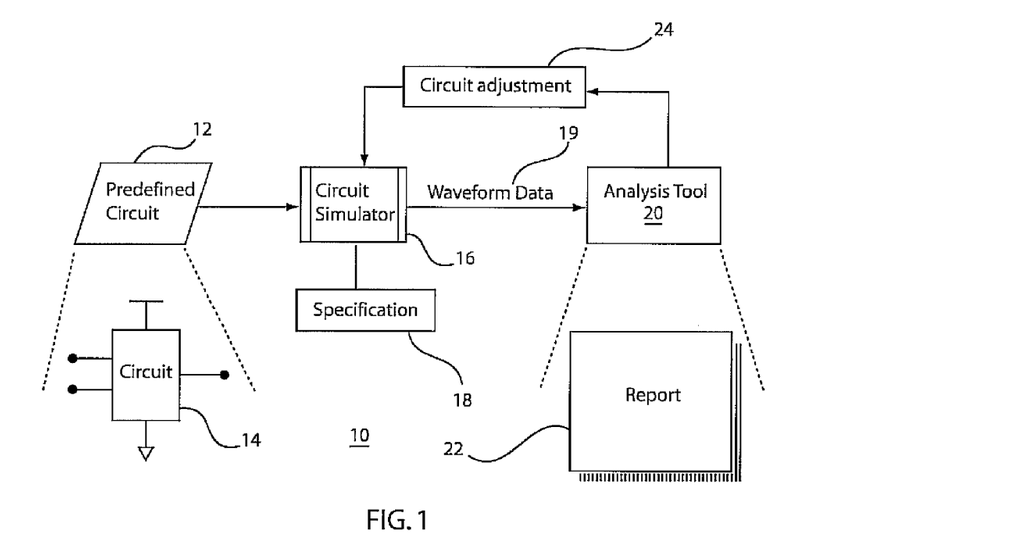
FIG. 1 is a block/flow diagram showing a system/method for glitch power analysis in accordance with one embodiment.

Referring now to the drawings in which like numerals represent the same or similar elements and initially to FIG. 1, a system/method for identifying glitches is illustratively shown in accordance with one embodiment. In block 12, a circuit 14 is selected or designed to run through a glitch analysis simulator 16. The circuit 14 may include a computer aided design schematic, a circuit listing or any other rendition of a circuit. The nature of the circuit 14 does not matter so long as the simulator can generate voltage waveform output and capacitance output for each net in the circuit in accordance with this example.

Figure 2:
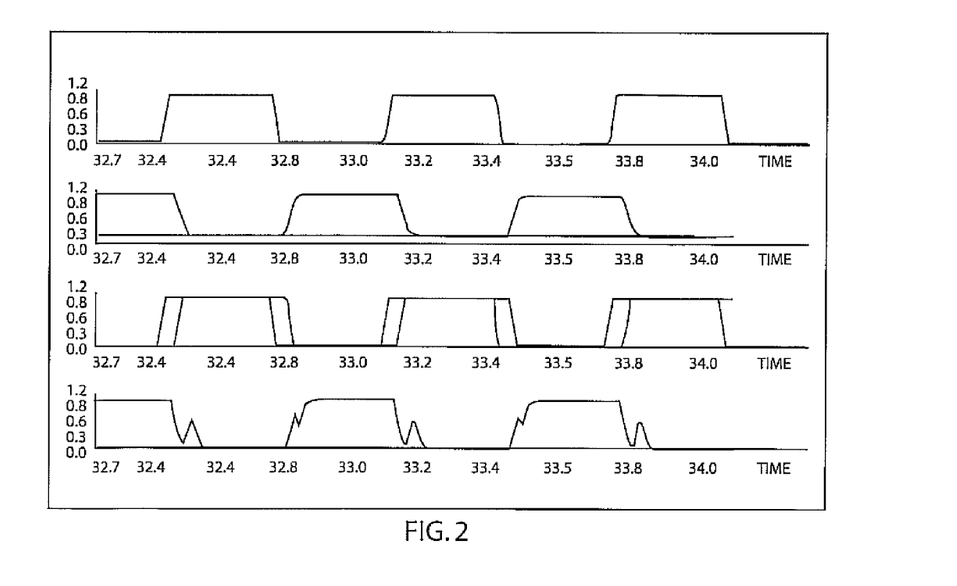
FIG. 2 is a diagram illustratively showing voltage waveforms in accordance with one embodiment.

The simulator 16 then tests the circuit by supplying various patterns to the input pins based on a user specification 18, and generates voltage waveform outputs 19 describing what happens inside the circuit 14. The voltage waveforms generated by the simulator (see e.g., FIG. 2) are then fed into a glitch analysis tool 20 to find the glitch power generated by the circuit 14. The glitch power is then summarized for the entire circuit in an output report 22, and specific net information is listed for a more granular analysis. In one embodiment, a circuit adjustment module 24 is configured to modify the circuit to reduce loss due to the glitch power. Module 24 may be implemented as part of analysis tool 20 or as part of simulator 16. Module 24 provides the capability to make adjustments to the circuit design to reduce the contribution to glitch power loss. This may include human input and/or machine generated feedback and/or controls. Glitch power reduction may be achieved by changing inputs, input values, circuit parameters, component sizes and/or capacities, or any other action to reduce glitch power.

Figure 3:
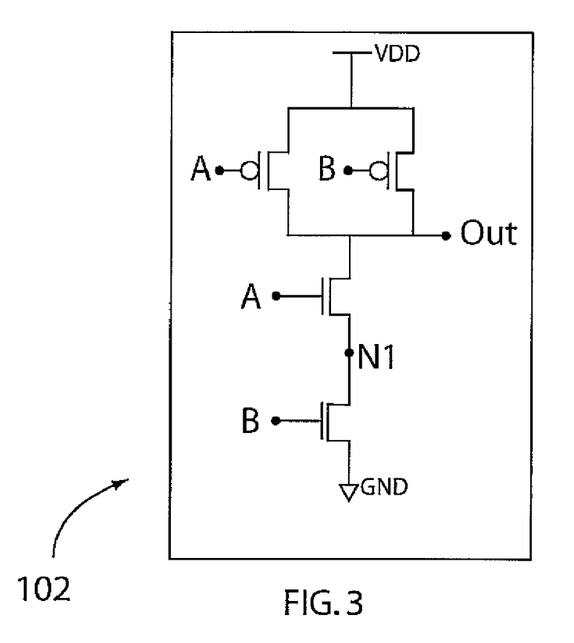
FIG. 3 is a schematic diagram showing an illustrative circuit employed to demonstrate aspects of the present invention.

Referring to FIG. 3, an illustrative circuit 102 is provided on which an example circuit analysis will be performed to further demonstrate the present principles. Table 1 shows a signal analysis provided for nodes A, B, N1 and OUT depicted in FIG. 3.

TABLE 1

| Signal Node | Total Node Capacitance* (pF) | Transitions | Total Source Energy** (pJ) | Optimal Transitions | Optimal Source Energy** (pJ) | Glitch Energy*** (pJ) |
|---|---|---|---|---|---|---|
| A | 0.02 | 1 | 0.00 | 1 | 0.00 | 0.00 |
| B | 0.01 | 1 | 0.01 | 1 | 0.01 | 0.00 |
| N1 | 0.002 | 1 | 0.00 | 1 | 0.00 | 0.00 |
| Out | 0.05 | 2 | 0.05 | 0 | 0.00 | 0.05 |

*Reported for all signal nodes by circuit simulator.
**Total energy dissipated in charging circuit and stored in node capacitance, assuming 1 volt source.
***Difference in "Total Source Energy" and "Optimal Source Energy".

Figure 4:
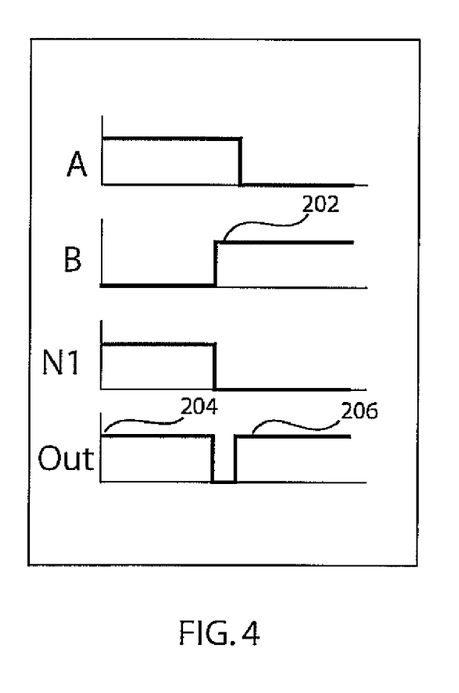
FIG. 4 is a timing diagram showing waveforms for points of interest in FIG. 3.

Waveforms corresponding to the basic circuit 102 of FIG. 3 are generated by the circuit simulator (16, FIG. 1) for a single clock cycle and depicted in FIG. 4. The glitch analysis tool 20 then calculates each of the elements in Table 1 to calculate the glitch power as a difference between total actual power and total optimal power. An optimal power is computed as a total power necessary to meet the transition requirements for the waveform during a particular cycle. For example, the waveform for node B has a single rising edge 202 (FIG. 4). In that case, the state at the beginning of the cycle is 0, and the state at the end of the cycle is 1, so an optimal number of edges needed to meet that requirement is 1 rising edge. Based on the voltage and capacitance associated with that particular waveform, the total energy needed to charge the capacitor is calculated as $CV^2$ where C is the capacitance and V is the voltage across the capacitor. The output node (OUT) starts at 1 at beginning 204, and ends at 1 at ending 206, so the optimal energy needed to charge that capacitor should be 0 for the cycle, however, the waveform shows us that the capacitor was clearly discharged, and then recharged which requires energy. A normal waveform is one that either changes states with a single rising or falling edge, or does not change states at all and includes no edges.

Referring to FIGS. 5-8, note that in each of the following diagrams, a vertical dotted line 301 represents the clock cycle boundary, and the two horizontal slotted lines 303 and 305 represent the rising and falling threshold boundaries. The x-axis represents time and the y-axis represents voltage. Since the values are arbitrary, they have been omitted from this example.

Figure 5:
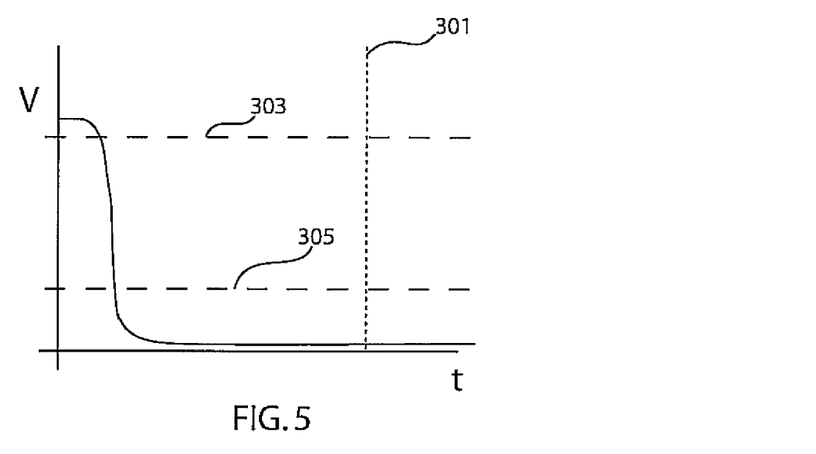
FIGS. 5-7 show voltage versus time diagrams for examples of normal waveforms in accordance with the present principles.
Figure 6:
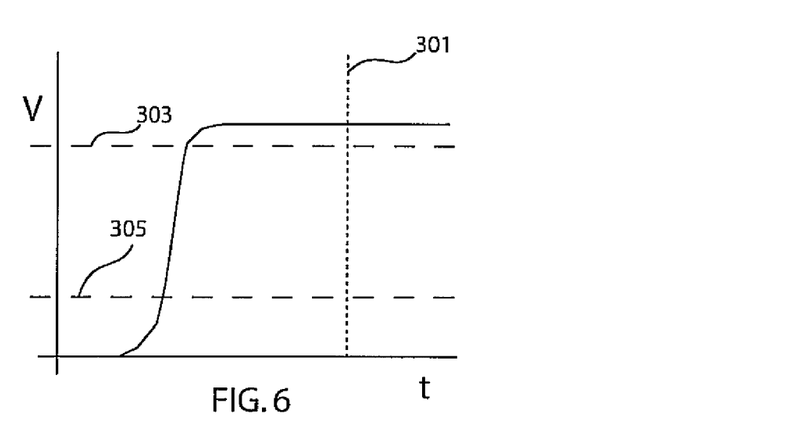

Referring to FIGS. 5 and 6, normal waveforms are presented switching from state 1 to 0 and 0 to 1, respectively.

There are no glitches in either of these waveforms as they do not use any more power than is needed.

Figure 7:
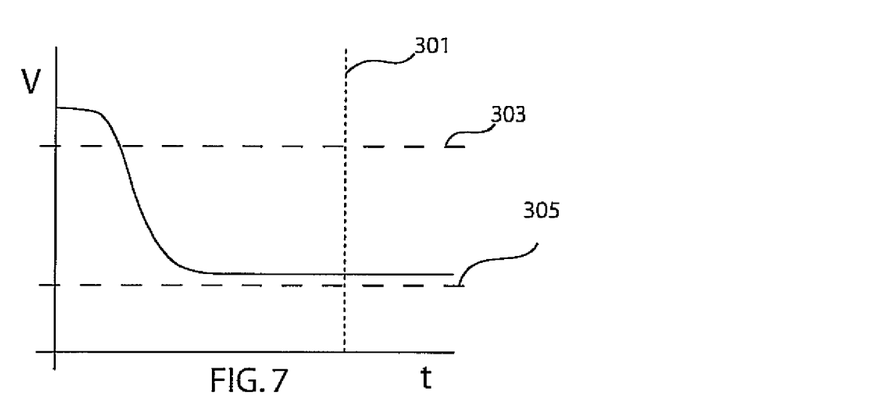

FIG. 7 illustrates another normal waveform that does not switch states, but also does not use any excess power during the clock cycle. In this case, the capacitor is partially discharged but no extra power is consumed during the clock cycle.

Figure 8:
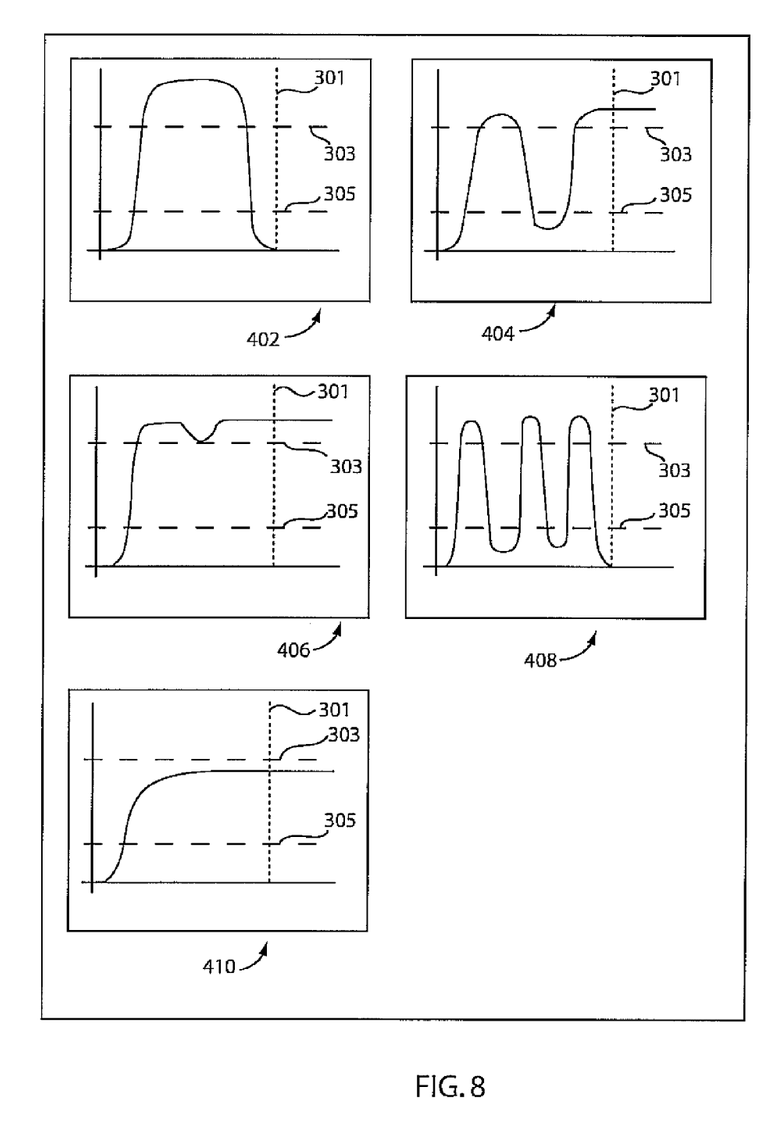
FIG. 8 shows voltage versus time diagrams for examples of waveforms where glitch power is detected in accordance with the present principles.

Referring to FIG. 8, different glitch waveforms are depicted. Each of the waveform diagrams 402-410 represents a case where glitch power is detected. These diagrams are illustrative of some but not all the possible glitch cases that might occur. In waveform 402, there is a rising and falling edge during a clock cycle. In this case, the cycle state both starts and ends at 0, so the optimal power usage should be 0. The additional "bump" in the waveform indicates that power was in fact used, so all of that power is considered "glitch" power. Similarly for the rest of the waveforms in FIG. 8, power is consumed when it need not be. E.g., in case 410, there is only a single rising edge, however since it does not cross the threshold boundary, the state of the circuit remains at 0 which essentially means that no power should have been used.

Figure 9:
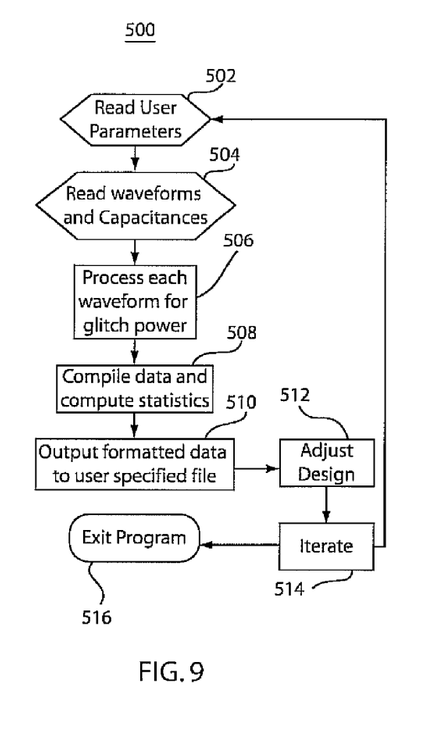
FIG. 9 is a block/flow diagram showing a system/method for glitch power analysis in accordance with another embodiment.

Referring to FIG. 9, a glitch detection system/method is illustratively described for a glitch detection tool 500 in accordance with one embodiment. In block 502, an end user specifies parameters such as clock cycle time, simulation time, waveform data, where the output should go, rising and falling threshold values, clock tolerance information, and other information depending on the scenario. In block 504, the analysis tool then reads in the waveform data, capacitances, etc. and processes it according to the user specifications in block 506. Once the data is calculated (compiled) and statistics computed in block 508, the data is sorted and output to the user specified file or screen, in block 510, where it can then be further analyzed. In accordance with the output data, design decisions and adjustments to circuits may be made in accordance with the glitch information in block 512. In block 514, the process may be repeated to reduce glitch power loss until a threshold is met or until a desired criteria is met. The program terminates and returns one of several codes to the system indicating the program exit status in block 516.

Figure 10:
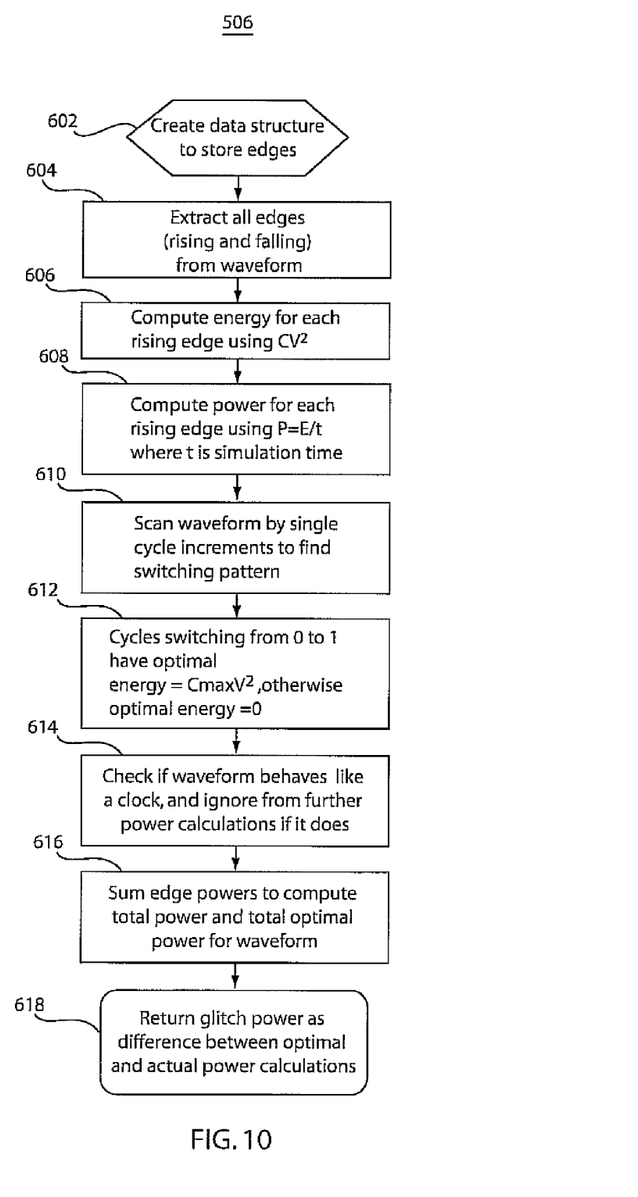
FIG. 10 is a block/flow diagram showing a system/method for processing each waveform in accordance with one embodiment.

Referring to FIG. 10, a more specific breakdown of block 506 for the system/method 500 is shown. FIG. 10 shows the basic process that occurs for each waveform in a collection being tested. Step 506 in FIG. 9 may employ the features of FIG. 10 for each waveform. In block 602, a data structure or structures are created or designated to store edges. Edges refers to the transitions that occur in waveform simulations of circuit components. In block 604, edges are extracted (rising and falling) from the waveforms generated by the simulations. In block 606, energy (E) is computed. For each rising edge, energy may be determined by $CV^2$. In block 608, power is computed for each rising edge, e.g., using $P=E/t$ where t is simulation time and E is the energy.

In block 610, the waveforms are scanned preferably in single cycle increments to determine a switching pattern in the waveform. In block 612, cycles switching from 0 to 1 have optimal energy=$C*maxV^2$, where maxV is the maximum voltage and C is the capacitance. Otherwise, optimal energy is zero. In block 614, the waveform is checked to see if it behaves like a clock. If the waveform behaves like a clock, exclude the waveform from further power calculations.

In block 616, sum the edge powers to compute total power and total optimal power for the waveform. In block 618, return glitch power as the difference between the total actual power (power) and optimal power.

Figure 11:
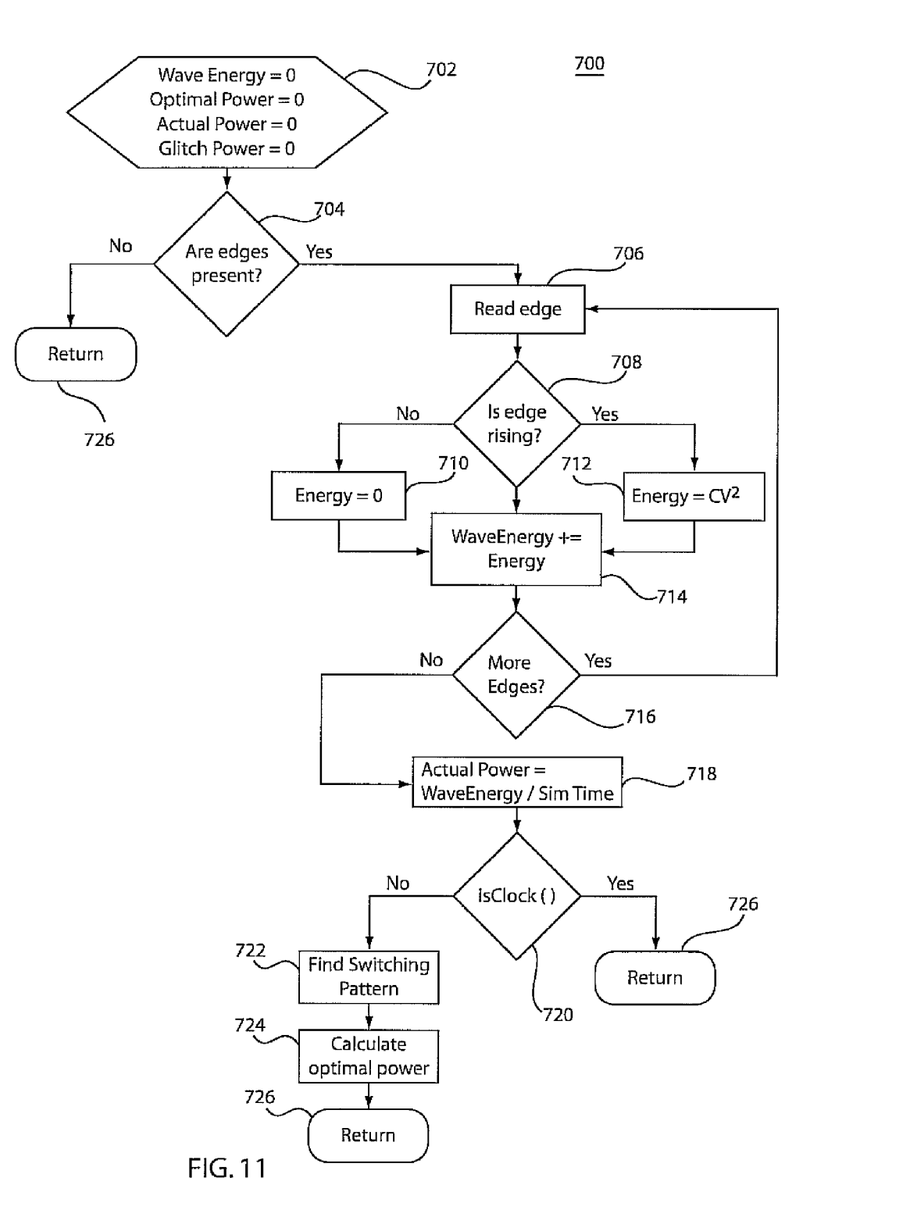
FIG. 11 is a block/flow diagram showing the system/method of FIG. 10 with additional details.

Referring to FIG. 11, for each waveform in the analysis, system/method 700 takes place. In block 702, wave energy, optimal energy, actual power and glitch power are all initialized to zero. In block 704, a determination of the presence of edges in a waveform is determined. If an edge is present, in block 706, the edge is read. In block 708, a determination of whether the edge is rising is made. If the edge is rising, energy ($E=CV^2$) is determined in block 712. Otherwise, in block 710, energy (E) equals 0. In block 714, energy is summed as wave energy (WaveEnergy) for all rising edges of the waveform. In block 716, a determination is made as to whether any more edges are present.

If more edges are present the path returns to block 706. If not, actual power is computed as the wave energy per unit simulation time (WaveEnergy/Sim time or $P=E/t$). Sim time may be one cycle. In block 720, a determination of whether the waveform acts like a clock is made. If the waveform acts like a clock, a switching pattern is determined for the waveform in block 722 and optimal power is computed in block 724.

Figure 12:
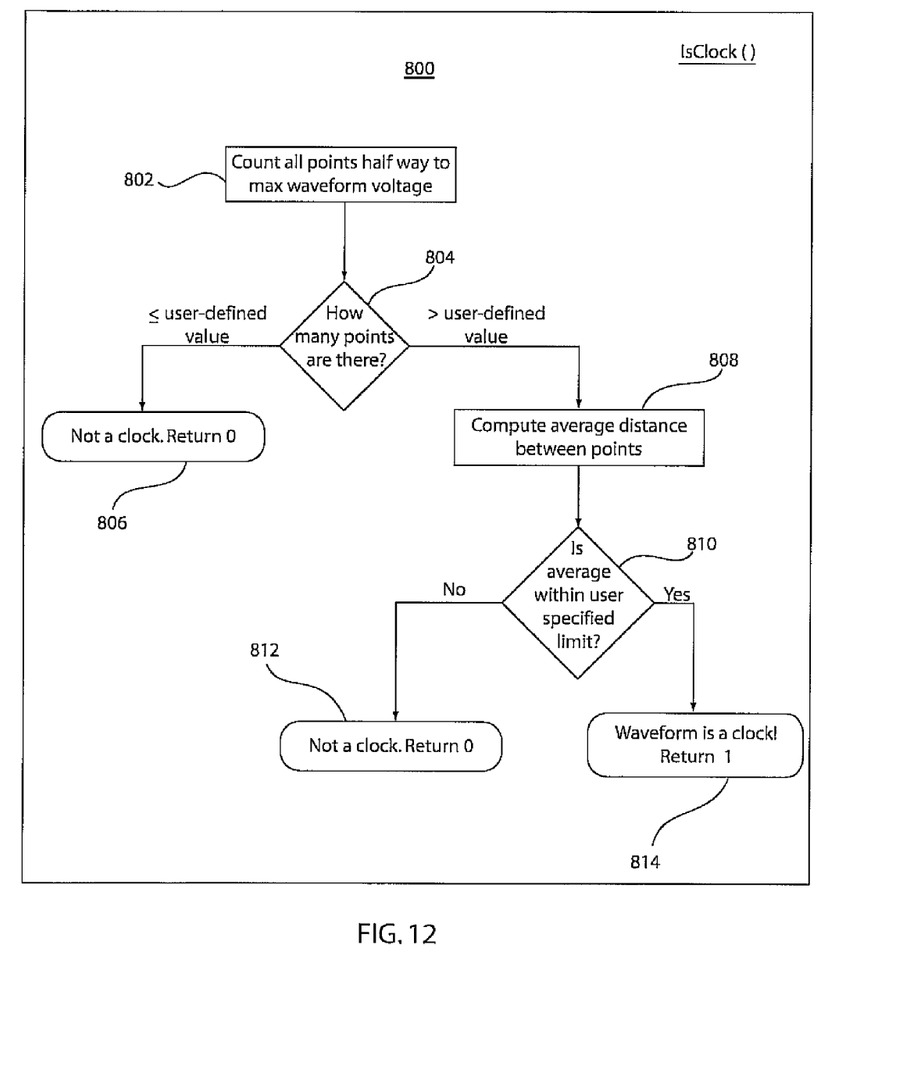
FIG. 12 is a block/flow diagram showing a system/method for determining if a waveform acts like a clock signal in accordance with one embodiment.

All of the rising and falling edges in the waveform are extracted, and the energies are totaled. When no more edges are present and the total power consumed by the circuit has been calculated, it is run through a process to determine if the waveform behaves like a regular clock signal or not (FIG. 12). Since clock signals can run at multiples of the clock cycle time, ignoring clock identification can lead to a much higher and inaccurate glitch calculation. As it can be shown in FIG. 11, the energies for each rising edge are added together until there are no more edges in the waveform. At that point, the power is calculated by dividing the energy by the simulation time. After that part of the process is complete, and the clock determination has been made, optimal power is calculated. The return block 726 returns the program path to block 704 for each new waveform or to the system/method 500, preferably to step 508 after all waveforms are checked.

Referring to FIG. 12, the IsClock( ) subroutine or module 800 employs user-defined threshold values to determine if the signal being tested is "periodic enough" to be considered a clock signal. Clock waveforms generally follow a very accurate cycle of rising and falling waveform edges, however, the user can adjust the tolerance to omit waveforms with clock-like properties from the glitch calculation. In block 802, a count of all points half of a maximum waveform voltage are obtained. In block 804, a determination of the counts is used to decide if the waveform is or acts like a clock. In this example, if the count is less than or equal to a user-defined value (e.g., 1), then the waveform is not a clock and zero is returned. If the count is greater than the user-defined value, compute the average distance between the points in block 808. The user-defined value permits the user to adjust the determination of a clock signal. In block 810, if the average is within a user specified limit or value, then the waveform is a clock and a "one" is returned in block 814. Otherwise, the waveform is not a clock and a "zero" is returned in block 812.

Figure 13:
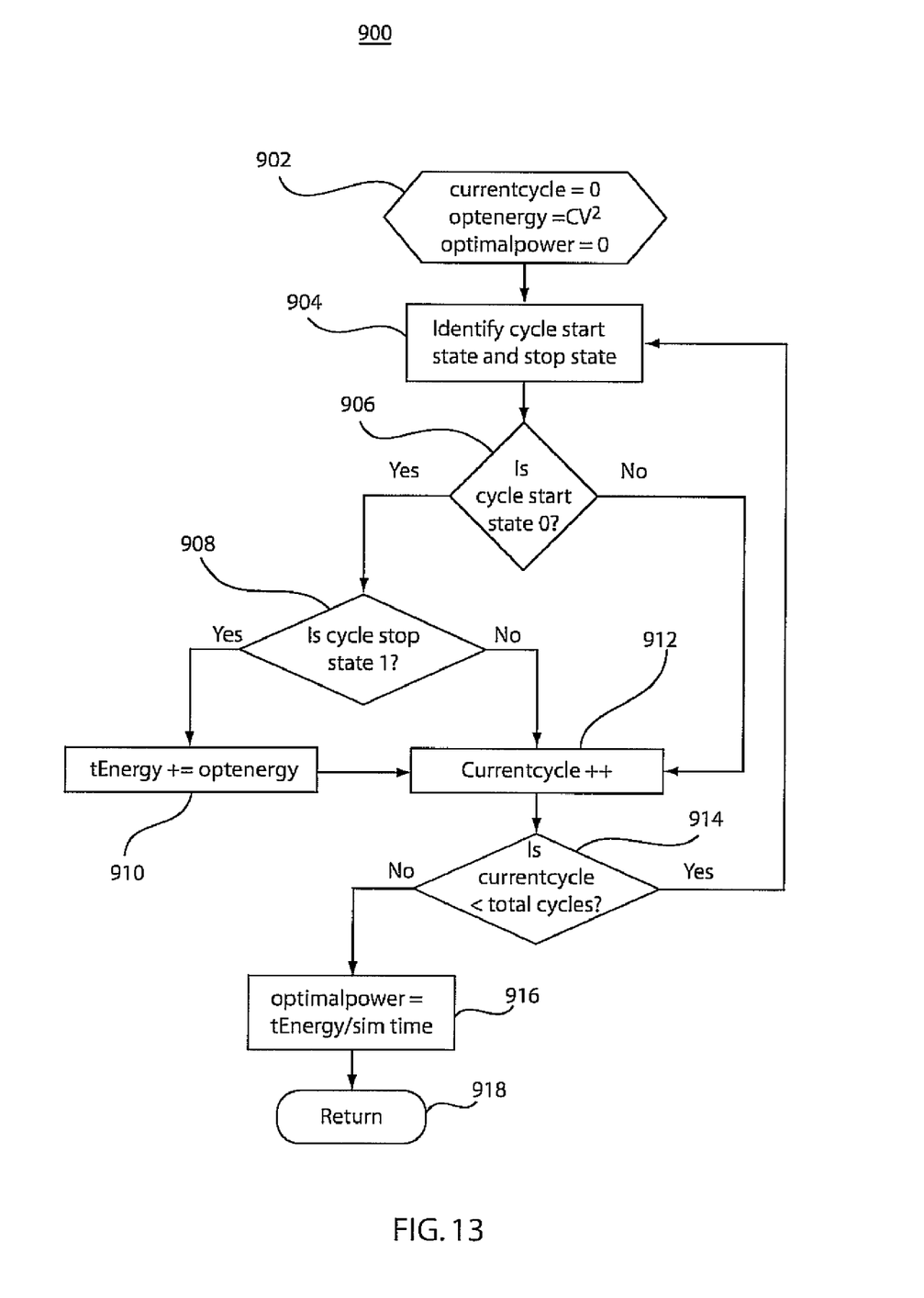
FIG. 13 is a block/flow diagram showing a system/method for determining optimal power in accordance with one embodiment.

Referring to FIG. 13, a block/flow diagram 900 shows a determination of optimal power for an arbitrary waveform. Diagram 900 shows greater detail for block 616 of FIG. 10. The glitch power calculation comes directly from this calculation as a difference between the optimal power and actual power. In block 902, current cycle (currentcycle) and optimal power (optimalpower) are initialized to zero. Optimal energy (optenergy) is set equal to $CV^2$. In block 904, the cycle start and stop states are determined. In block 906, a determination is made as to whether the start is below a threshold (e.g., starts at state zero). If the start state is zero, a determination is made is block 908 as to whether the cycle stop state is 1 (or upper threshold). If in blocks 906 and 908 the answer is no, then the current cycle count is incremented (currentcycle++) in block 912. If the stop state is "one" and the start state is "zero", then in block 910, total energy (tEnergy) is set equal to optoenergy. Then, in block 912, the current cycle is incremented.

In block 914, a check is made as to whether all cycles have been checked. For example, currentcycle<total cycles. If more cycles need to be checked, the path returns to block 906. Otherwise, if no cycle remains, in block 916, optimalpower is determined as tEnergy/sim time. In block 918, the path returns to block 508 (FIG. 9).

Having described preferred embodiments of a system and method for glitch analysis in circuits (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for analyzing power glitch, comprising:
   simulating a circuit to provide waveform responses at positions of interest in the circuit;
   processing each waveform response with a processor to determine glitch power for the waveform response by comparing optimal energy to actual energy for the waveform; and
   adjusting the circuit to reduce loss due to the glitch power.

2. The method as recited in claim 1, wherein processing includes computing power for every rising edge in the waveform.

3. The method as recited in claim 2, further comprising determining a switching pattern for the waveform to determine if a transition state contributes to the optimal energy.

4. The method as recited in claim 1, wherein processing includes:
   checking whether the waveform functions as a clock signal; and
   if the waveform functions as a clock signal, removing the waveform from computation of the glitch power.

5. The method as recited in claim 4, further comprising adjusting criteria for determining if the waveform functions as a clock signal.

6. The method as recited in claim 1, further comprising summing edge powers for all waveforms to determine a total optimal power and a total power for all the waveforms wherein the glitch power is the difference between the total optimal power and the total power.

7. A computer program product for analyzing power glitch comprising a computer useable medium including a computer readable program, wherein the computer readable program when executed on a computer causes the computer to perform the steps of:
   simulating a circuit to provide waveform responses at positions of interest in the circuit;
   processing each waveform response with a processor to determine glitch power for the waveform response by comparing optimal energy to actual energy for the waveform; and
   adjusting the circuit to reduce loss due to the glitch power.

8. The computer program product as recited in claim 7, wherein processing includes computing power for every rising edge in the waveform.

9. The computer program product as recited in claim 8, further comprising determining a switching pattern for the waveform to determine if a transition state contributes to the optimal energy.

10. The computer program product as recited in claim 7, wherein processing includes:
    checking whether the waveform functions as a clock signal; and
    if the waveform functions as a clock signal, removing the waveform from computation of the glitch power.

11. The computer program product as recited in claim 10, further comprising adjusting criteria for determining if the waveform functions as a clock signal.

12. The computer program product as recited in claim 7, further comprising summing edge powers for all waveforms to determine a total optimal power and a total power for all the waveforms wherein the glitch power is the difference between the total optimal power and the total power.

13. A system for analyzing power glitch, comprising:
    a simulator configured to simulate a circuit to provide waveform responses at positions of interest in the circuit;
    an analysis tool configured to analyze each waveform response to determine glitch power for the waveform response by comparing optimal energy to actual energy for the waveform; and
    a circuit adjustment module configured to modify the circuit to reduce loss due to the glitch power.

14. The system as recited in claim 13, wherein the analysis tool is configured to compute power for every rising edge in the waveform and to determine a switching pattern for the waveform to determine if a transition state contributes to the optimal energy.

15. The system as recited in claim 13, wherein the analysis tool includes a clock checking module configured to check whether the waveform functions a clock signal and if the waveform functions as a clock signal, to remove the waveform from computation of the glitch power.

16. The system as recited in claim 15, further comprising user-adjustable criteria to permit a user to adjust whether the waveform functions as a clock signal.

17. The system as recited in claim 13, further comprising a summing mechanism to sum edge powers for all waveforms to determine a total optimal power and a total power for all the waveforms wherein the glitch power is the difference between the total optimal power and the total power.

18. The system as recited in claim 13, wherein the waveforms include voltage versus time waveforms and the power and optimal power are computed based on capacitance and voltage per cycle.

19. The system as recited in claim 13, wherein the waveforms contribute to glitch power based upon staring states and ending states.

20. The system as recited in claim 13, wherein the analysis tool outputs a glitch power listing to determine glitch power loss from the points of interest.

* * * * *